(12) United States Patent
Fitzgerald et al.

(10) Patent No.: US 7,084,648 B2
(45) Date of Patent: Aug. 1, 2006

(54) SEMICONDUCTOR TESTING

(75) Inventors: David J. Fitzgerald, Inver Grove Heights, MN (US); David W. Kelly, Lino Lakes, MN (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/953,585

(22) Filed: Sep. 29, 2004

(65) Prior Publication Data

US 2006/0066322 A1   Mar. 30, 2006

(51) Int. Cl.
   *G01R 27/08* (2006.01)
(52) U.S. Cl. ..................... 324/713; 324/527
(58) Field of Classification Search .............. 324/713
   See application file for complete search history.

(56) References Cited

U.S. PATENT DOCUMENTS

| 5,659,255 | A | 8/1997 | Strid et al. |
| 5,999,010 | A | 12/1999 | Arora et al. |
| 6,127,831 | A | 10/2000 | Khoury et al. |
| 6,261,854 | B1 | 7/2001 | Akram et al. |
| 6,262,580 | B1 | 7/2001 | Wu |
| 6,323,661 | B1 | 11/2001 | Wildes et al. |
| 6,469,537 | B1 | 10/2002 | Akram et al. |
| 6,597,182 | B1 | 7/2003 | Tachibana |
| 6,734,458 | B1 | 5/2004 | Kim et al. |
| 6,777,967 | B1 | 8/2004 | Iino et al. |

*Primary Examiner*—Vincent Q. Nguyen

(57) ABSTRACT

A method of testing a semiconductor circuit including a pair of contact pads, a biasing circuit for applying a voltage to the pair of contact pads, and a sensing circuit for providing a signal indicative of the voltage applied across the contact pads. The method includes determining a voltage gain and voltage offset of the sensing circuit while the biasing circuit is disabled. The method also includes enabling the biasing circuit to produce a voltage across the contact pads and determining, from the resulting output voltage produced by the sensing circuit, an actual output voltage produced by the biasing circuit at the contact pads based on the determined voltage gain and voltage offset of the sensing circuit.

19 Claims, 4 Drawing Sheets

US 7,084,648 B2

SEMICONDUCTOR TESTING

FIELD OF THE INVENTION

The invention generally related to the field of semiconductor devices and, more particularly, to a method for testing semiconductor devices.

BACKGROUND OF THE INVENTION

In the field of semiconductor devices, it is generally desired to decrease the time required to test semiconductor devices. For certain types of semiconductor circuits that provide an output and a sensed parameter indicative of the output, it may be quicker to test the output directly (for example, using known wafer probing techniques) instead of monitoring the sensed parameter. However, accumulation of contact pad material or contaminants on test probe tips used to connect to contact pads on a semiconductor device being tested may affect output measurements. For example, aluminum or aluminum oxide scraped from surfaces of contact pads with which the probe tip is forcibly brought into contact may adhere to and accumulate on the probe tip. The accumulation of such material on the probe tip results in a gradual increase of an electrical resistance (contact resistance) between the probe tip and a contact pad with which the probe tip is subsequently brought into contact.

It is to be understood that the following detailed description is exemplary and explanatory only and not to be viewed as being restrictive of the present, as claimed. These and other aspects, features and advantages of the present invention will become apparent after a review of the following description of the preferred embodiments and the appended claims.

DESCRIPTION OF PREFERRED EMBODIMENTS

Figure 1:
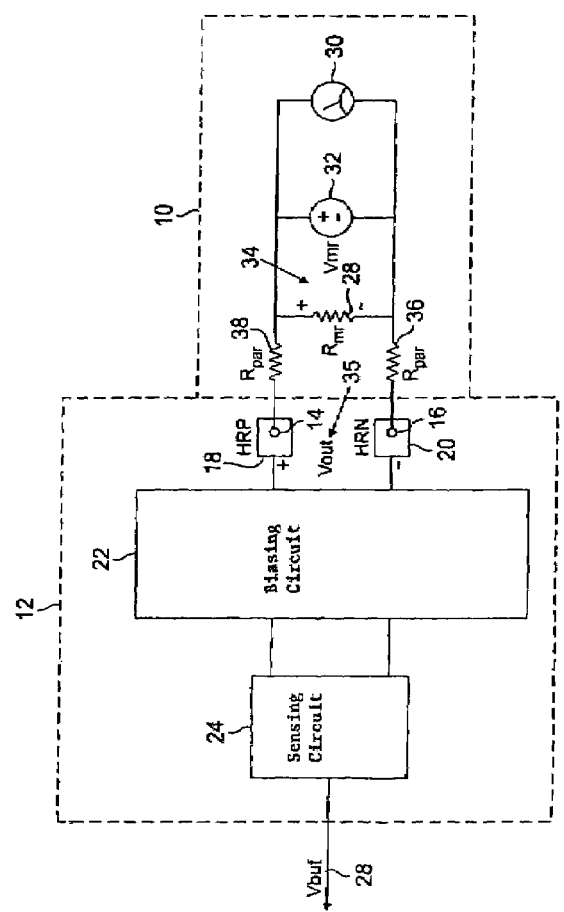
FIG. 1 shows a schematic diagram of a semiconductor circuit connected to a test fixture.

FIG. 1 depicts a schematic of a test fixture 10 used to perform electrical tests of a spemiconductor circuit 12 of a semiconductor device that provides an output and a sensed parameter indicative of the output. The test fixture 10 may include test probes 14, 16 for electrically connecting to contact pads (HRP) 18, (HRN) 20 of the circuit 12 to allow electrical signals to be applied to or read from the circuit 12 during testing. The test fixture 10 may include a load resistor Rmr 28, a voltage source 32, and a voltmeter 30. The circuit 12 may include a biasing circuit 22 for providing a bias voltage and/or a bias current across the load resistor Rmr 28 connected across the contact pads HRP 18, HRN 20, thereby developing an output voltage Vout 35 across the contact pads. For example, the biasing circuit 22 may be configured to produce a desired Vout 35 across the contact pads in response to a programmed input. The circuit 12 may also include a sensing circuit 24 for sensing Vout 35 across the contact pads and providing an externally accessible signal, Vbuf 28 indicative of Vout 35.

Conventionally, the output voltage Vout 35 produced across the contact pads HRP 18, HRN 20 may be tested by monitoring the externally accessible signal Vbuf 28 to ensure a programmed input produces a Vout 35 within a desired range of the programmed input value. However, due to inherent delays in the sensing circuitry 24, a time delay between applying a programmed Vout 35 and providing an externally accessible signal, Vbuf, 28 indicative of Vout 35 may be excessively long. However, by reading Vout 35 more directly, such as be measuring the voltage Vmr 34 across the resistive element Rmr 28, the time required to perform a measurement may be reduced compared to monitoring Vbuf 28 genrated by the sensing circuitry 24. One problem with testing such circuits 12 by attempting to directly measure Vout 35 is that a parasitic resistance (modeled as series resistors Rpar 36, 38) present in test fixtures 14 connected via contact pads of the circuit 12 may cause differences between Vout 35 and measured Vmr 34. Accordingly, the inventors have developed an innovative method to determine the parasitic resistance so that Vout 35 may be calculated based on a direct measurement of Vmr 34, thereby allowing quicker testing of such semiconductor circuits 12.

According to one embodiment of the invention, a method of testing a semiconductor circuit 12 comprising an electrical biasing circuit 22 applying a voltage Vout 35 to a pair of contact pads HRP 18, HRN 20 and a sensing circuit 24 providing a signal, Vbuf 28, indicative of Vout 35, comprises connecting a load resistor Rmr 28 across the pair of contact pads HRP 18, HRN 20 and then disabling the biasing circuit 22 so that no bias is applied to the contact pads HRP 18, HRN 20 by the biasing circuit 22. Then, the sensing circuit 24 may be calibrated by applying a first predetermined voltage to the contact pads HRP 18, HRN 20, for example, by the voltage source 32, and measuring a first output voltage of Vout 35 produced by the sensing circuit 24 in response to the first predetennined voltage. A second predetermined voltage may then be applied to the contact pads HRP 18, HRN 20, and a second output voltage of Vout 35 produced by the sensing circuit 24 in response to the second predetermined voltage is measured. A voltage gain and voltage offset of the sensing circuit 24 is then calculated based on the first and second output voltages corresponding to the first and second predetermined voltages, respectively.

After performing the calibration of the sensing circuit 24, the applied voltage is removed, such as by turning off the voltage source 32, and the biasing circuit 22 is enabled to produce a desired voltage across the contact pads HRP 18, HRN 20. A third output voltage of Vout 35 produced by the sensing circuit 24 in response to the desired voltage is measured, and an actual output voltage of Vout 35 at the contact pads HRP 18, HRN 20 (based on the previously calculated voltage gain and voltage offset of the sensing circuit 24) is determined. The load resistor voltage Vmr 34 across the load resistor Rmr 28 induced by the actual output voltage is measured by using voltage meter 30. The parasitic resistance Rpar 36,38 in series with the load resistor Rmr 28 is then calculated based upon any difference between the actual output voltage of Vout 35 and Vmr 34.

Once the parasitic resistance Rpar 36, 38 is determined, a biasing circuit 22 output voltage of Vout 35, produced in response to a programmed output voltage, may be calculated. The resulting biasing circuit output voltage of Vout 35 may then be compared to the programmed output voltage to determine if Vout 35 is within a desired range of values of the programmed output voltage. For example, Vout 35 may be derived using known voltage division techniques across Rmr 28 and the parasitic resistances Rpar 36, 38.

Figure 2:
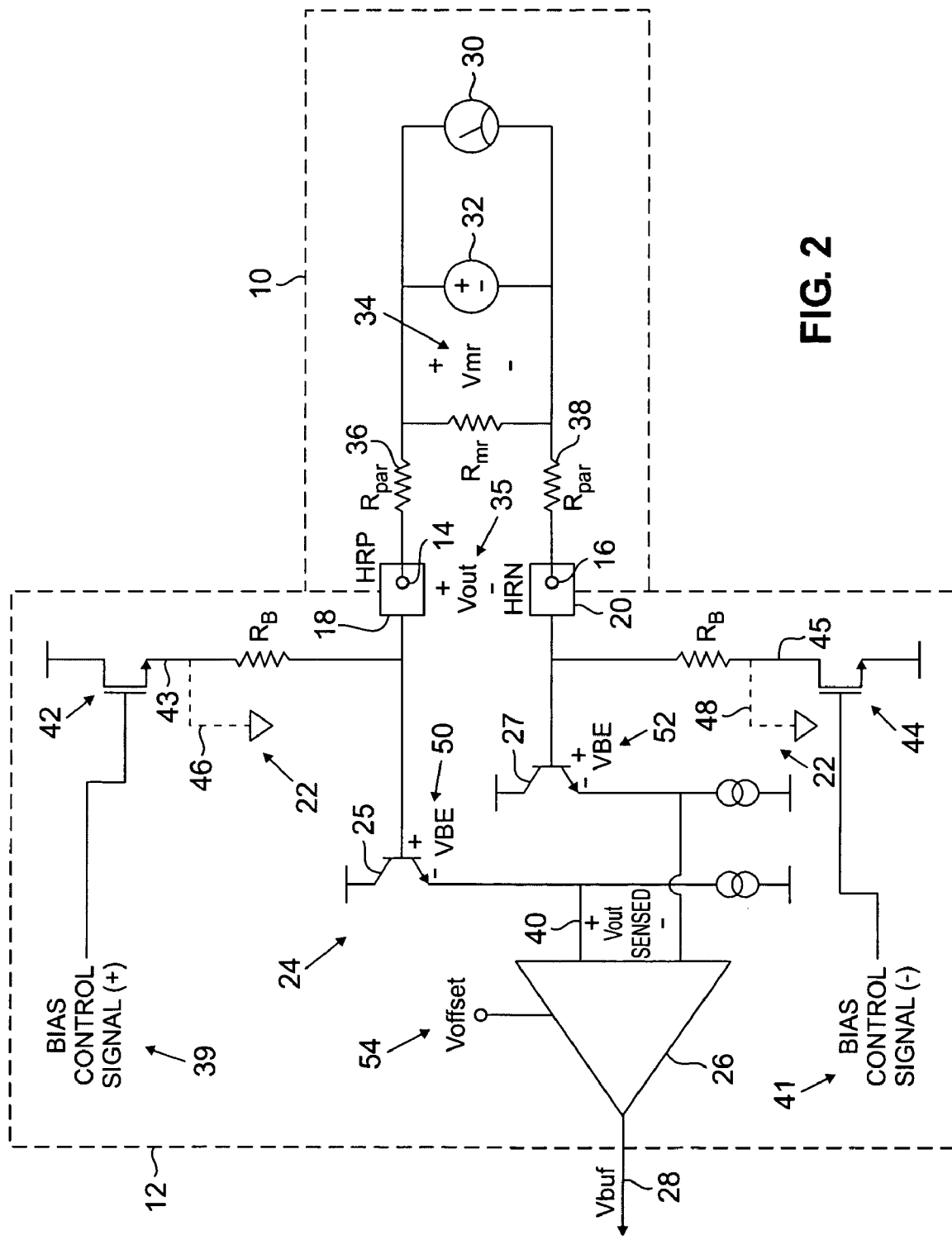
FIG. 2 shows a schematic diagram of an exemplary embodiment of the semiconductor circuit of FIG. 1 connected to a test fixture.

In an embodiment of the invention shown in FIG. 2, the circuit 12 undergoing test may include an integrated circuit for a read/write drive head preamplifier, for example, of a type used in a disk drive system. The circuit 12 may include connections, such as the contact pads HRP 18 and HRN 20, for connecting the circuit 12 to a read/write magneto-resistive drive head (not shown). The circuit 12 includes a biasing circuit 22 that may include MOSFETs 42, 44 configured to drive a biasing voltage responsive to respective bias control signals 39, 41 derived for example, from a sensed voltage across the contact pads HRP 18 and HRN 20. The circuit 12 may also include sensing circuitry 24 for sensing Vout 35 across the contact pads HRP 18 and HRN 20, and an amplifier 26 for providing an externally accessible signal, Vbuf 28 indicative of the sensed voltage Vout (sensed) 40 corresponding to Vout 35. The sensing circuitry 24 may include bipolar transistors 25, 27 configured as emitter follower devices used to sense Vout 35 and provide Vout(sensed) 40 to the amplifier 26.

When configured as a drive head preamplifier, the circuit 12 may adjust a programmed bias Vout 35 applied to the drive head in response to a sensed voltage Vout(sensed) 40 indicative of the voltage Vout 35 read across the drive head. The test fixture 10 may be configured to simulate a drive head and may include the resistive element, Rmr, 28, a pair of probes 14, 16 for contacting respective contact pads HRP 18, HRN 20, a voltmeter 30 for measuring the voltage, Vmr, 34 across Rmr 28, and a voltage source 32 for applying a voltage across Rmr 28.

When connected to the test fixture 10 at the contact pads HRP 18, HRN 20, the circuit 12 senses a voltage Vout (sensed) 40 responsive to Vmr 35 and any voltage induced by parasitic resistance Rpar 36, 38 present in series with the Rmr 28. Such parasitic resistances Rpar 36, 38 may cause Vmr 40 across Rmr 28 to be different from a voltage Vout 35 sensed by the circuit across contact pads HRP 18, HRN 20. Consequently, if Vmr 40 is used to determine if the circuit 12 is operating with in a desired range, the effect of parasitic resistance Rpar 36, 38 must be taken into account. As the parasitic resistance increases, such as may happen with an increasing accumulation of containments on the probe tips, the measured Vmr 34 may increasingly diverge from an actual Vout 35, resulting in an erroneous indication of Vout 35. Although Vbuf 28 provides a readily available indication of Vout 35, in the interest of speed, it may be desired to use Vmr 34, which may be directly measured, to determine if the circuit 12 is applying the proper values of Vout 35 corresponding to programmed inputs. For example, it may take about one millisecond after a programmed Vout 35 is applied by the biasing circuit 22 for the sensing circuit 24 to generate Vbuf 28. However, Vmr 40 may be directly measured within about 100 nanoseconds of Vout 35 being applied by the biasing circuit 22. For example, if there are 128 programmable voltage levels required to be tested per circuit 12 and there are 8000 such circuits 12 to be tested on a wafer, directly measuring Vmr 40 instead of monitoring Vbuf 28 may result in an approximate testing time savings of about 17 minutes per wafer.

In the exemplary circuit 12 depicted in FIG. 1, the innovative method of measuring the parasitic resistance may be implemented as described below. When the test fixture 10 is connected to the circuit 12, the voltage Vmr 34 measured across the resistive element Rmr 28 may be expressed as:

$$V_{mr} = (HRP - HRN)\frac{R_{mr}}{R_{mr} + 2R_{par}} \quad (1)$$

An error in Vmr 34 measured across Rmr 28 as compared to a differential voltage HRP−HRN, (Vout 35), measured across the contact pads HRP 18, HRN 20 may be expressed as:

$$Err = \left[\left(\frac{R_{mr}}{R_{mr} + 2R_{par}}\right) - 1\right] * 100\% \quad (2)$$

For nominal values of Rmr 28 and Rpar 36, 38 equal to 40 ohms and 0.75 ohms respectively, the error in Vmr 34 is, according to equation (2), approximately 3.6%. In an exemplary embodiment of a head preamplifier circuit, an allowable deviation from a programmed bias voltage may be ±7 mV ±3%. An error of 3.6%, resulting from a parasitic resistance in the test fixture 10, therefore, may exceed a predetermined amount of error allowed for this test parameter. Consequently, acceptable circuits may test as being unacceptable due to the effects of parasitic resistances in the test fixture, such as a probe contact resistance.

An indication of the sensed voltage Vout 35 may be provided by the amplifier shown in FIG. 2. The amplifier 26 senses voltage, Vout(sensed) 40 indicative of Vout 35, (which would be equal to Vmr 34 if no parasitic resistance were present) and drives a sensing signal Vbuf 28 off chip, for example, as a single ended voltage responsive to the sensed voltage Vout(sensed) 40. Vbuf 28 may be provided to an analog to digital converter (not shown) whose output may be read via a serial port control register (not shown). The sensed voltage, Vout(sensed) 40, may be buffered by the amplifier 26 with a gain, A, typically equal to about 5 Volts/Volt (V/V). The amplifier 26 may also add a predetermined offset value, Voffset 54, to the sensing signal Vbuf 28. For example, Voffset 54 may have a value of about 500 mV.

As generally described above, circuit parameters related to the sensing signal Vbuf 28, such as gains and the predetermined voltage offset of the amplifier 26, voltage offsets induced by the emitter followers, and the parasitic resistances Rpar 36, 38 in series with the Rmr 28 of the test fixture 10, may be calculated. Accordingly, the effects caused by these circuit parameters may be back calculated out of voltage Vmr 34 measured during testing of the circuit 12 to accurately determine Vout 35 based on Vmr 34.

Figure 3:
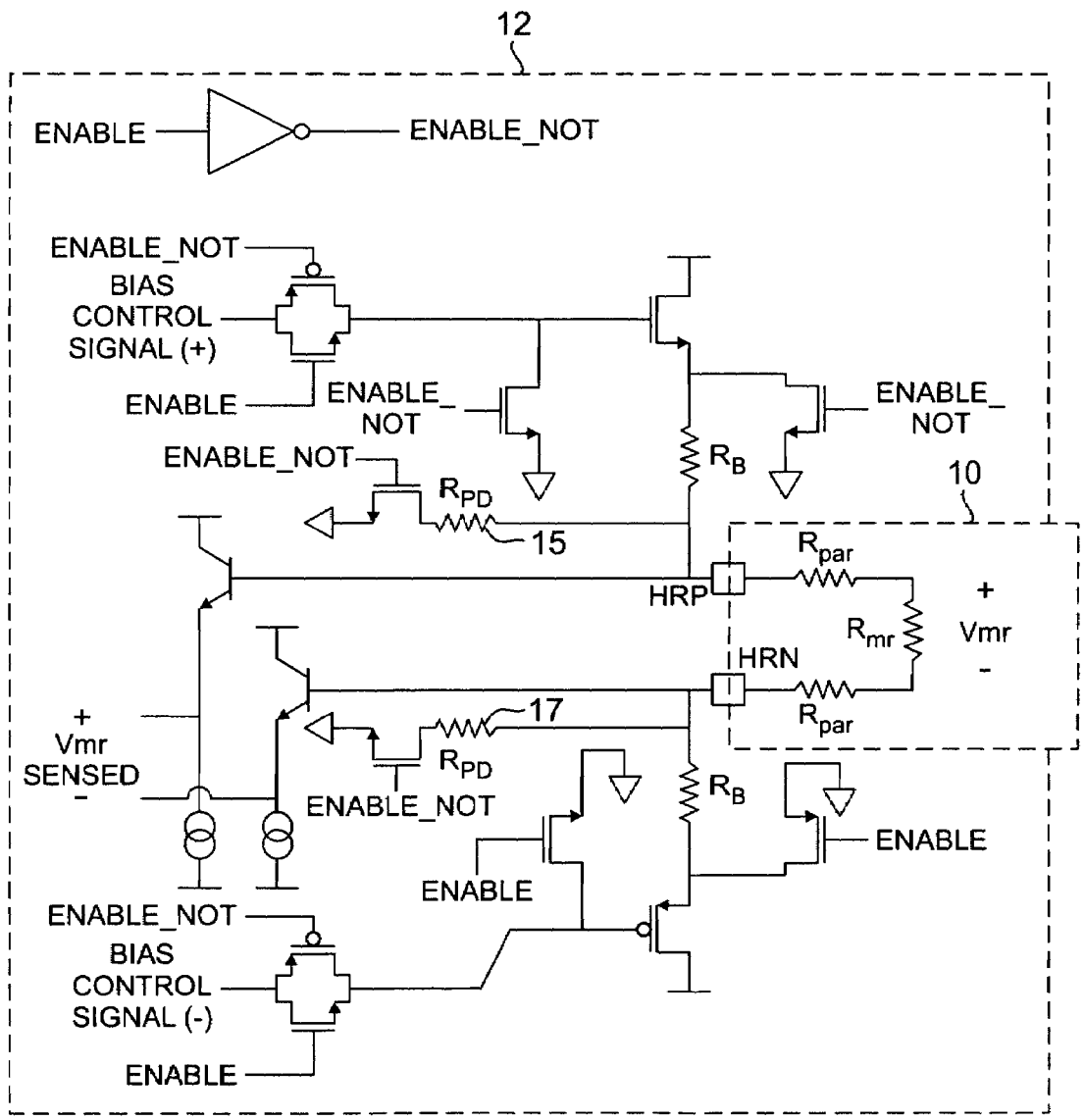
FIG. 3 shows schematic diagram of an exemplary embodiment of the semiconductor circuit of FIG. 2 configured for a calibration mode.
Figure 4:
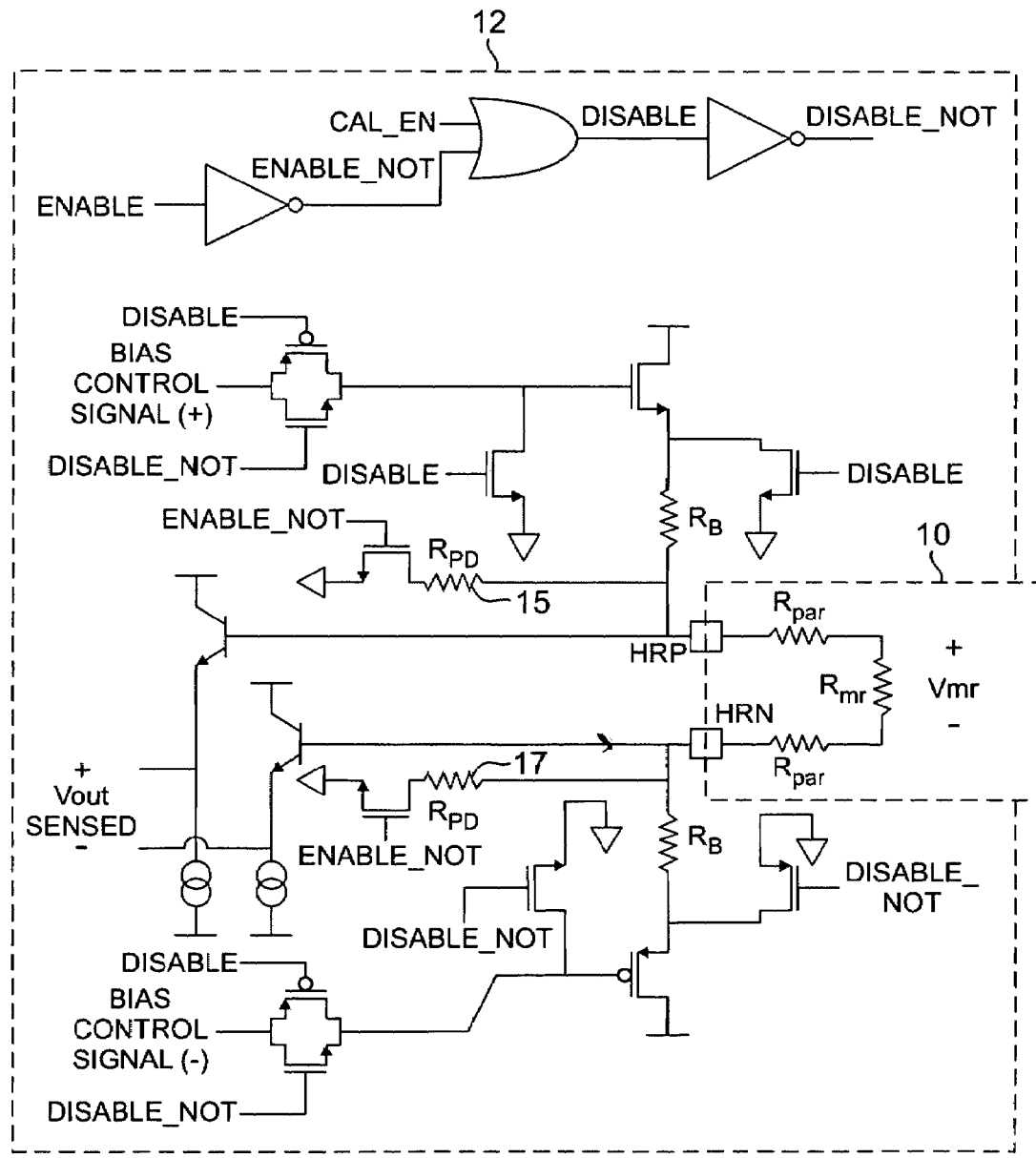
FIG. 4 shows schematic diagram of an exemplary embodiment of the semiconductor circuit of FIG. 2 configured for a calibration mode.

To calibrate the sensing signal Vbuf 28, the circuit 12 may be configured for a calibration mode of operation. For example, in the head preamplifier embodiment, the circuit 12 may be placed in a read mode and the bias circuit disabled, such as by grounding the sources 43, 45 of biasing transistors 42, 44, respectively, (as indicated by the dotted grounded legs 46, 48) so that no bias is applied to the contact pads HRP 18, HRN 20. As shown in the exemplary circuits of FIGS. 3 and 4, MOSFET devices may be used as switches to configure the circuit 12 for a calibration mode. In some head preamplifier embodiments including a selectable grounding path for the contact pads HRP 18, HRN 20 (for example, via respective resistors Rpd 15, 17 having values in the range of 10 to 100 Ohms), the grounding path may be disabled during calibration. As a result an increased low frequency input impedance (approximately equal to $2*R_B$)

may be achieved than if the contact pads HRP 18, HRN 20 are clamped to ground through respective resistors Rpd 15, 17 as may be desired during a normal operation mode to help protect a read head connected to the circuit 12 from voltage transients when writing. Accordingly, an increased sensitivity measurement of a contact resistance may be obtained.

Once in calibration mode, a voltage Vmr 34 may be applied across Rmr 28 by voltage source 32. The voltage at the contact pads HRP 18, HRN 20 resulting induced by application of Vmr 34 may be sensed by the emitter follower circuit 24 and made available via the amplifier 26 as Vout(sensed) 40 according to the equation (3):

$$V_{buf} = V_{offset} + A * V_{out(sensed)} \tag{3}$$

In an embodiment of the circuit 12, Voffset 54 may be 500 mV and A may be 5. Accordingly, for a Vout(sensed) 40 of 200 mv, Vbuf 28, should ideally be 1.5 volt, according to equation 3. When a voltage is applied across Rmr 28 by the voltage source 32 while the circuit 12 is in the calibration mode, the Vout(sensed) 40 may be expressed by (4):

$$V_{out(sensed)} = V_{mr(applied)} * \frac{R_b}{R_b + R_{par}} \tag{4}$$

For example, if the voltage applied across Rmr 28 is 0.0 volts, then, ideally, Vout(sensed) 40 should be 0.0 V. However, there will be some offset term, $\Delta V_{BE}$, associated with a $V_{BE}$ 50, 52 mismatch between the emitter follower devices 24, 25 used to sense the read head bias voltage. Thus, a more accurate equation for Vout(sensed) becomes (5):

$$V_{out(sensed)} = V_{mr(applied)} * \frac{R_b}{R_b + R_{par}} + \Delta V_{BE} \tag{5}$$

In addition, there may also be an offset error $\Delta V_{OFFSET}$ associated with the $V_{OFFSET}$ 54. Including $\Delta V_{OFFSET}$, equation (3) may be expressed as (6):

$$Vbuf = V_{offset} + \Delta V_{offset} + A * \left[ V_{mr(applied)} * \frac{R_b}{R_b + R_{par}} + \Delta V_{BE} \right] \tag{6}$$

$\Delta V_{offset}$ and $\Delta V_{BE}$ may be grouped into one term, $\Delta V_{IN}$, by referring $\Delta V_{offset}$ to an input by dividing $\Delta V_{offset}$ by a gain applied to the $V_{out(sensed)}$ 40 signal to create $\Delta V_{offset(input\ referred)}$ as shown in (7):

$$\Delta Vin = \Delta V_{BE} + \Delta V_{offset(input\_refered)} \tag{7}$$

Accordingly, equation (6) may be reduced to (8):

$$Vbuf = V_{offset} + A * \left[ V_{mr(applied)} * \frac{R_b}{R_b + R_{par}} + \Delta V_{in} \right] \tag{8}$$

In the calibration mode, a first calibration voltage, such as 0.0 volts, may by applied across Rmr by the voltage source 32, so that the measured Vbuf 28 becomes (9):

$$Vbuf = V_{offset} + A * [\Delta V_{in}] \tag{9}$$

A second calibration voltage, such as 100 millivolts, may then be applied across Rmr 28 and the resulting Vbuf value measured to determine the gain, A of the amplifier 26. The measured gain, A (measured), may be extracted by dividing the difference of the Vbuf voltage measured by the difference between the respective first and second applied calibration voltages as shown in equation (10):

$$A_{(measured)} = \frac{Vbuf(100\ mV) - Vbuf(0.0\ mV)}{100\ mV - 0.0\ mV} \tag{10}$$

Substituting equation (9) into (10):

$$A_{measured} = \frac{V_{offset} + A * \left[ V_{mr(applied)} * \frac{R_b}{R_b + R_{par}} + \Delta V_{in} \right]}{100\ mV} \tag{11}$$

$$\frac{-V_{offset} - A * \left[ V_{mr(applied)} * \frac{R_b}{R_b + R_{par}} + \Delta V_{in} \right]}{100\ mV}$$

Accordingly, A(measured) becomes 12:

$$A_{measured} = A * \left[ \frac{R_b}{R_b + R_{par}} \right] \tag{12}$$

The error in the gain measured Err(gain) may be calculated as (13):

$$Err_{(gain)} = \left[ \frac{R_b}{R_b + R_{par}} \right] * 100\% \tag{13}$$

Assuming nominal values for $R_B$ of 300 ohms and $R_{par}$ of 0.5 ohms, Err(gain) is 0.17% and may be considered negligible so that A(measured) is approximately equal to The gain A and can be calculated according to equation (10).

Solving equation (9) for $\Delta Vin$ (14):

$$\Delta Vin \cong \frac{Vbuf - V_{offset}}{A} \tag{14}$$

Therefore, the calibrated output for Vbuf for a Voffset of 500 millivolts becomes (15):

$$Vbuf = V_{offset} + A * [HRP - HRN + \Delta V_{in}] \tag{15}$$

where A and $V_{IN}$ may be calculated from equations (10) and (14) respectively. The calibration step may be performed for each circuit 12 tested because $\Delta$Vbe and $\Delta$Voffset may be different among different circuits 12.

After circuit parameters such as A and $\Delta$Vin have been determined during the calibration mode, the circuit 12 may be placed in an operational mode to determine the parasitic resistance Rpar 36, 38 in the test fixture 10. For example, the circuit 12 may be configured to apply a voltage bias to the contact pads HRP 18, HRN 20 across the parasitic resistances 36, 38 in series with the Rmr 28. Vbuf 28 may be monitored to obtain Vout (sensed) 40 corresponding to the bias circuit applied bias voltage. In addition, the Vmr 34 across Rmr 28 induced by the circuit applied bias may be measured, for example, by the voltmeter 30 in the test fixture 10. The voltage differential across the contact pads HRP 18 and HRN 20, Vout 35, may then be represented from the circuit side by rearranging equation (15) as shown in (16):

$$HRP - HRN = \frac{Vbuf - V_{offset}}{A} - [\Delta V_{in}] \quad (16)$$

In addition, Vout 35 may also be represented from the test fixture side as in equation (1). The parasitic resistance Rpar 36, 38 present in the test fixture may be represented by rearranging equation (1) as shown in (17):

$$R_{par} = \frac{R_{mr} * [HRP - HRN - V_{mr}]}{2 * V_{mr}} \quad (17)$$

Substituting equation (16) into (17) gives an equation for $R_{par}$ that can be solved by substituting the values for the know test circuit value $R_{mr}$, the measured voltage value $V_{mr}$, a predetermined circuit V(offset), the values for A and ΔVin determined during the calibration mode, and Vbuf 28 measured during circuit 12 biasing:

$$R_{par} = \frac{R_{mr} * \left[ \left( \frac{Vbuf - V_{offset}}{A} - \Delta Vin \right) - V_{mr} \right]}{2 * V_{mr}} \quad (18)$$

A calculated $R_{par}$ for each circuit 12 tested may be monitored during acceptance testing of circuits to determine if the parasitic resistance, $R_{par}$, such as the contact resistance of the wafer probes 14, 16, is becoming too high. In addition, Vout may be calculated based on the test fixture measured Vmr 34 and $R_{par}$ 36, 38 in series with Rmr 28 as (19):

$$V_{out} = (HRP - HRN) = V_{mr} * \frac{R_{mr} + 2 * Rpar}{R_{mr}} \quad (19)$$

The calculated value of Vout 35 may be compared to a predetermined range of acceptable voltage values to determine if the circuit is opening with the range. Accordingly, the effects of parasitic resistance, such as probe contact resistance, may be factored out during testing to achieve more accurate test results. Other circuit test parameters that depend on a value of Rmr 28 that includes parasitic resistance in series may be corrected to include the effects of a calculated parasitic resistance using the above described method.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A method of testing a semiconductor circuit, the circuit including a pair of contact pads and a biasing circuit for applying a voltage to the pair of contact pads, and further including a sensing circuit for providing a signal indicative of the voltage applied across the contact pads, the method comprising:
   connecting a load resistor across the pair of contact pads;
   disabling the biasing circuit;
   applying a first predetermined voltage to the contact pads;
   measuring a first output voltage produced by the sensing circuit in response to the first predetermined voltage;
   applying a second predetermined voltage to the contact pads;
   measuring a second output voltage produced by the sensing circuit in response to the second predetermined voltage;
   calculating the voltage gain and voltage offset of the sensing circuit based on the first and second output voltages corresponding to the first and second predetermined voltages, respectively;
   removing the applied voltage;
   enabling the biasing circuit to produce a desired voltage across the contact pads;
   measuring a third output voltage produced by the sensing circuit in response to the desired voltage;
   determining, from the third output voltage, an actual output voltage produced by the biasing circuit at the contact pads based on the previously calculated voltage gain and voltage offset of the sensing circuit;
   measuring a load resistor voltage across the load resistor induced by the actual output voltage; and
   calculating a parasitic resistance in series with the load resistor based upon any difference between the actual output voltage and the load resistor voltage.

2. The method of claim 1, further comprising using the parasitic resistance to calculate a biasing circuit output voltage at the pair of contact pads in response to a programmed output voltage based upon the measured output voltage across the load resistor.

3. The method of claim 2, further comprising comparing the biasing circuit output voltage to the programmed output voltage to determine if a value of the biasing circuit output voltage is within a desired range of values of the programmed output voltage.

4. The method of claim 2, wherein the biasing circuit output voltage is calculated according to the formula:

$$V_{out} = V_{mr} * \frac{R_{mr} + 2 R_{par}}{R_{mr}} = V_{mr} * \frac{R_{mr} + R_{par(total)}}{R_{mr}}$$

wherein Vout is the biasing circuit output voltage, Vmr is the load resistor voltage, Rmr is a value of load resistor, and Rpar(total) is the total parasitic resistance in series with the load resistor.

5. The method of claim 1, wherein the voltage gain of the sensing circuit is calculated according to the formula:

$$A_{(measured)} = \frac{V_{buf(v2)} - V_{buf(v1)}}{V_{mr(2)} - V_{mr(1)}}$$

wherein A(measured) is the voltage gain of the sensing circuit, Vbuf(v2) is the second output voltage; Vbuf(v1) is the first output voltage; Vmr(2) is the second predetermined voltage; and Vmr(1) is the first predetermined voltage.

6. The method of claim 5, wherein the voltage offset of the sensing circuit is calculated according to the formula:

$$\Delta Vin = \frac{V_{buf} - V_{offset}}{A}$$

wherein $\Delta V_{in}$ is the voltage offset, Vbuf is an output voltage produced by the sensing circuit in response to a predetermined voltage being 0.0 volts, and Voffset is a predetermined voltage offset of the sensing circuit.

7. The method of claim 6, wherein the parasitic resistance is calculated according to the formula:

$$R_{par(total)} = \frac{R_{mr} * \left[\left(\frac{V_{buf} - V_{offset}}{A} - \Delta Vin\right) - V_{mr}\right]}{V_{mr}}$$

wherein $R_{par(total)}$ is a total series parasitic resistance, Rmr is the value of load resistor, Vbuf is the third output voltage produced by the sensing circuit in response to the desired voltage, and Vmr is the load resistor voltage.

8. The method of claim 1, wherein applying at least one of the first and second predetermined voltages to the contact pads comprises applying a voltage of 0.0 volts.

9. A method of testing a semiconductor circuit, the circuit including a pair of contact pads and a biasing circuit for applying a voltage to the pair of contact pads, and further including a sensing circuit for providing a signal indicative of the voltage applied across the contact pads, the method comprising:
  determining a voltage gain and voltage offset of the sensing circuit while the biasing circuit is disabled; and
  enabling the biasing circuit to produce a voltage across the contact pads and determining, from the resulting output voltage produced by the sensing circuit, an actual output voltage produced by the biasing circuit at the contact pads based on the determined voltage gain and voltage offset of the sensing circuit.

10. The method of claim 9, further including:
  measuring a load resistor voltage across a load resistor connected between the contact pads, the load resistor voltage being induced by the actual output voltage at the contact pads; and
  calculating a parasitic resistance in series with the load resistor based upon any difference between the actual output voltage and the load resistor voltage.

11. The method of claim 10, further comprising using the parasitic resistance to calculate, based upon the load resistor voltage, the actual output voltage at the contact pads produced by the biasing circuit in response to a programmed output voltage.

12. A method of testing a semiconductor circuit, the circuit including a pair of contact pads and a biasing circuit for applying a voltage to the pair of contact pads, and further including a sensing circuit for providing a signal indicative of the voltage applied across the contact pads, the method comprising:
  determining a voltage gain and voltage offset of the sensing circuit while the biasing circuit is disabled;
  enabling the biasing circuit to produce a voltage across the contact pads and determining, from the resulting output voltage produced by the sensing circuit, an actual output voltage produced by the biasing circuit at the contact pads based on the determined voltage gain and voltage offset of the sensing circuit;
  measuring a load resistor voltage across a load resistor connected between the contact pads, the load resistor voltage being induced by the actual output voltage at the contact pads;
  calculating a parasitic resistance in series with the load resistor based upon any difference between the actual output voltage and the load resistor voltage; and using the parasitic resistance to calculate, based upon the load resistor voltage, the actual output voltage at the contact pads produced by the biasing circuit in response to a programmed output voltage.

13. The method of claim 12, further comprising comparing the actual output voltage at the contact pads produced by the biasing circuit to the programmed output voltage to determine if a value of the biasing circuit output voltage is within a desired range of values of the programmed output voltage.

14. The method of claim 12, wherein determining a voltage gain and voltage offset of the sensing circuit comprises:
  applying a first predetermined voltage to the contact pads;
  measuring a first sensed output voltage produced by the sensing circuit in response to the first predetermined voltage;
  applying a second predetermined voltage to the contact pads;
  measuring a second sensed output voltage produced by the sensing circuit in response to the second predetermined voltage; and
  calculating the voltage gain and voltage offset of the sensing circuit based on the first and second sensed output voltages corresponding to the first and second predetermined voltages, respectively.

15. The method of claim 14, wherein applying at least one of the first and second predetermined voltages to the contact pads comprises applying a voltage of 0.0 volts.

16. The method of claim 14, wherein the actual output voltage produced by the biasing circuit is calculated according to the formula:

$$V_{out} = V_{mr} * \frac{R_{mr} + 2R_{par}}{R_{mr}} = V_{mr} * \frac{R_{mr} + R_{par(total)}}{R_{mr}}$$

wherein Vout is the actual output voltage, Vmr is the load resistor voltage, Rmr is a value of load resistor, and Rpar(total) is the total parasitic resistance in series with the load resistor.

17. The method of claim 14, wherein the voltage gain of the sensing circuit is calculated according to the formula:

$$A_{(measured)} = \frac{V_{buf(v2)} - V_{buf(v1)}}{V_{mr(2)} - V_{mr(1)}}$$

wherein A(measured) is the voltage gain of the sensing circuit, Vbuf(v2) is the second sensed output voltage; Vbuf(v1) is the first sensed output voltage; Vmr(2) is the second predetermined voltage; and Vmr(1) is the first predetermined voltage.

18. The method of claim 14, wherein the voltage offset of the sensing circuit is calculated according to the formula:

$$\Delta Vin = \frac{V_{buf} - V_{offset}}{A}$$

wherein $\Delta V_{in}$ is the voltage offset, Vbuf is a sensed output voltage produced by the sensing circuit in response to a predetermined voltage being 0.0 volts, and Voffset is a predetermined voltage offset of the sensing circuit.

19. The method of claim 18, wherein the parasitic resistance is calculated according to the formula:

$$R_{par(total)} = \frac{R_{mr} * \left[ \left( \frac{V_{buf} - V_{offset}}{A} - \Delta Vin \right) - V_{mr} \right]}{V_{mr}}$$

wherein $R_{par(total)}$ is a total series parasitic resistance, Rmr is the value of load resistor, Vbuf is the resulting output voltage produced by the sensing circuit in response to the actual output voltage, and Vmr is the load resistor voltage.

* * * * *